United States Patent

Liu

Patent Number: 5,824,588
Date of Patent: Oct. 20, 1998

[54] DOUBLE SPACER SALICIDE MOS PROCESS AND DEVICE

[75] Inventor: Han-Hsing Liu, Shuang-Hsi, Taiwan

[73] Assignee: Winbond Electronics Corp., Hsinchu, Taiwan

[21] Appl. No.: 719,139

[22] Filed: Sep. 24, 1996

[30] Foreign Application Priority Data

Jun. 27, 1996 [TW] Taiwan .................................. 85107754

[51] Int. Cl.$^6$ ...................... H01L 21/336; H01L 21/3205
[52] U.S. Cl. ......................... 438/302; 438/305; 438/592; 438/655
[58] Field of Search ....................... 437/41, 44; 438/302, 438/305, 592, 655

[56] References Cited

U.S. PATENT DOCUMENTS

| | | | |
|---|---|---|---|
| 5,330,925 | 7/1994 | Lee et al. | 437/44 |
| 5,352,631 | 10/1994 | Sitaram et al. | 437/44 |
| 5,424,234 | 6/1995 | Kwon | 437/44 |
| 5,468,665 | 11/1995 | Lee et al. | 437/44 |
| 5,496,751 | 3/1996 | Wei et al. | 437/44 |
| 5,518,945 | 5/1996 | Bracchitta et al. | 437/44 |

FOREIGN PATENT DOCUMENTS

| | | |
|---|---|---|
| 0575099 | 12/1993 | European Pat. Off. . |
| 0007126 | 1/1985 | Japan . |
| 0002135 | 1/1990 | Japan . |
| 405190566 | 7/1993 | Japan . |
| 406333941 | 12/1994 | Japan . |

OTHER PUBLICATIONS

Wolf, Stanley "Silicon Processing For The VLSI Era Vol. 1: Process Technology", Lattice Press, pp. 191–194 no month 1986.

Primary Examiner—David Graybill
Assistant Examiner—Michael S. Lebentritt
Attorney, Agent, or Firm—Ladas & Parry

[57] ABSTRACT

A double spacer salicide MOS device structure and a process for preparing such a device. The double spacer salicide device has a LDD structure. The first sidewall spacer disposed adjacent to the gate structure of the MOS device is higher than the gate. During the salicide process, the first sidewall spacer is used to effectively isolate the gate from the source/drain. The second sidewall spacer disposed adjacent to the first sidewall spacer is used to form the LDD structure.

14 Claims, 4 Drawing Sheets

DOUBLE SPACER SALICIDE MOS PROCESS AND DEVICE

BACKGROUND OF THE INVENTION

1. Field of the Invention

The present invention relates in general to a semiconductor device and a process for manufacturing thereof and, more particularly, to a process for fabricating salicide (self-aligned silicide) MOS devices having a double spacer structure and to a double spacer salicide MOS device with an elongated distance between a gate and a source/drain of the MOS device for isolation between these electrodes.

2. Description of the Related Art

The self-aligned silicide (SALICIDE) process, which uses titanium (Ti) or platinum (Pt) to react with silicon material and forms contact regions, has recently become increasingly popular in the semiconductor industry. MOS or MIS (metal-insulator-semiconductor) devices with a salicide structure have less sheet resistance in their electrodes (including gates, sources and drains) and less contact resistance in the contact regions between these electrodes than conventional ones.

FIG. 1 (PRIOR ART) is a cross-sectional view of a conventional salicide MOS device, where the MOS device is deposited over semiconductor substrate 1 and has LDD (Lightly Doped Drain) structure. Gate oxide 10 and gate polysilicon 12 constitute a gate structure of the MOS device, where gate polysilicon 12 is doped by N-type or P-type impurities and serves as a conductor. During the normal operation, a "channel" comprising a lot of free electric carriers (electrons or holes) will appear beneath gate oxide 10 when a moderate voltage is applied to gate polysilicon 12. Lightly doped region 30 and heavily doped region 32, embedded in substrate 1 and located on opposing sides of the gate structure, constitute the source and drain electrodes of the MOS device. The region of each of the source and drain electrodes can be divided into two parts, a lightly doped region and a heavily doped region, in view of the impurity concentration within each electrode. Such a distribution is referred to as the LDD structure. The LDD structure is usually produced by, after forming lightly doped regions 30, applying an ion implantation treatment to form heavily doped regions 32 using sidewall spacers 18 as an implantation mask. It should be noted that sidewall spacers 18 lying adjacent to side walls of the gate structure are not only used to form the LDD structure, but also to isolate the electrodes of the MOS device from each other. Salicide regions 40a are formed together and deposited individually over gate polysilicon 12 and heavily doped regions 32, to connect the underlying electrodes to other prescribed electrodes.

The process for producing salicide is described as follows. At first, a titanium or platinum metal layer is formed continuously over the topography of the MOS device structure by sputtering or other methods. Then the material in the metal layer, by a thermal treatment, reacts with silicon material within the gate and the source/drain regions to form silicide. At this time, metal material outside these silicon regions will not react and remains unchanged. Finally, the unchanged metal is removed. Spacers 18, usually made of oxide, do not react with titanium or platinum and, therefore, salicide regions 40a can be isolated from each other.

However, there is a potential drawback to the conventional structure of the salicide MOS device. Referring to FIG. 1, the lateral distance of the gate and the source/drain, mainly separated by spacers 18, is quite small. If titanium/platinum or its residua remain on the sidewall spacers, a short-circuit between the electrodes may occur. In addition, the possibility of a short-circuit due to conductive material residua increases significantly as the IC dimensions shrink. A decrease of the thickness of the sidewall spacers is a key cause of short-circuits in such a case.

In the present invention, a novel structure of double spacer MOS devices is used to solve such a problem. U.S. Pat. Nos. 5,183,771 and 5,208,472 also disclosed structures of double spacer salicide MOS or MIS devices. However, the disclosed structures suffer from inferior isolation between gates and sources and between gates and drains. This is because the height of the gate electrodes are the same as that of the double sidewall spacers in such device structures. In addition, migration of the compound produced during the reaction of silicon and titanium may also cause short-circuits.

SUMMARY OF THE INVENTION

It is therefore an object of the present invention to provide a double spacer salicide MOS device, which has superior isolation between the gate and the source and between the gate and the drain. Such a double spacer salicide MOS process has a large process window, which can prevent short-circuiting between gates and sources/drains.

The present invention achieves the object by providing a novel double spacer salicide MOS device on a substrate. In the MOS device, a gate structure is disposed upon the substrate, and a source and a drain, each of which includes a lightly doped region and a heavily doped region, located adjacent to the gate structure on the opposing sides. A first sidewall spacer that is higher than the gate structure is disposed upon the substrate and adjacent to the gate structure. Then a second sidewall spacer is disposed upon the substrate and adjacent to the first sidewall spacer. Silicide compound is generated upon the gate structure, the heavily doped source and drain regions.

For producing the MOS device structure, the present invention provides a method for fabricating salicide MOS devices. The method includes the following steps. First, a oxide layer, a polysilicon layer and a stuffed layer are successively deposited on the substrate. The stuffed layer is preferably made of silicon oxide with a thickness of between about 200 Å and 600 Å. Then the stuffed layer, the polysilicon layer and the oxide layer are etched by means of a predetermined photomask defining the polysilicon layer and the oxide layer as a gate structure. Thereafter, a first dielectric layer, preferably made of silicon nitride, is continuously formed on a top face and side walls of the structure of the stuffed layer and the gate structure. Using ion implantation or other methods, lightly doped source and drain regions are subsequently formed in the substrate adjacent to the side walls of the gate structure. Then, the first dielectric layer is anisotropically etched to form a first sidewall spacer at the side walls of the gate structure. A second sidewall spacer is formed at the side walls of the first sidewall spacer by common methods, followed by removal of the stuffed layer. Owing to the existence of the stuffed layer, the first sidewall spacer is higher than the gate structure.

BRIEF DESCRIPTION OF THE DRAWINGS

The detailed description of an embodiment of the present invention is made with reference to the accompanying drawings, wherein.

DETAILED DESCRIPTION OF THE PREFERRED EMBODIMENTS

In the double spacer salicide MOS device of the present invention, there is a first sidewall spacer of silicon nitride and a second sidewall spacer of silicon oxide, which are used to increase the process window and prevent short-circuiting between the gate and the source or between the gate and the drain. The first spacer, which is formed at side walls of a gate structure of the MOS device and higher than the gate structure, elongates the distance between device electrodes and improves the isolation performance. The second spacer, which is disposed at side walls of the first spacer, is used to form the LDD structure of the MOS devices.

FIG. 2 to FIG. 7 shows a process for fabricating double spacer salicide MOS devices in accordance with the present invention. In the process step shown in FIG. 2, oxide layer 10 and polysilicon layer 12 are sequentially formed on substrate 1. Oxide layer 10 is relatively thin, between approximately 50 Å and 200 Å, and serves as an insulator member in the metal-oxide-semiconductor transistors. This layer should be fabricated under a strictly controlled environment to prevent contamination by alkaline ions, such as $Na^+$ and $K^+$. Polysilicon layer 12 is preferably formed by low-pressure chemical vapor deposition, LPCVD) and has a thickness of between approximately 1000 Å and 3000 Å. Polysilicon layer 12 may serve as a conductor member in the metal-oxide-semiconductor transistors after doping with N-type or P-type impurities.

Figure 1:
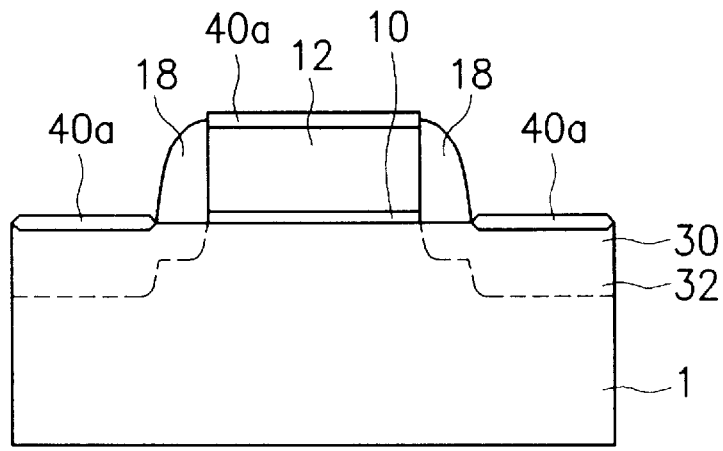
FIG. 1 (PRIOR ART) is a cross-sectional view of a conventional salicide MOS device.
Figure 2:
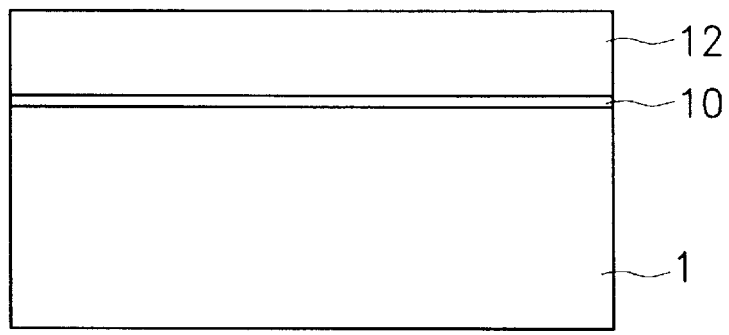
FIG. 2 to FIG. 7 are cross-sectional views showing a process for fabricating a double spacer salicide MOS device in the embodiment of the present invention.
Figure 3:
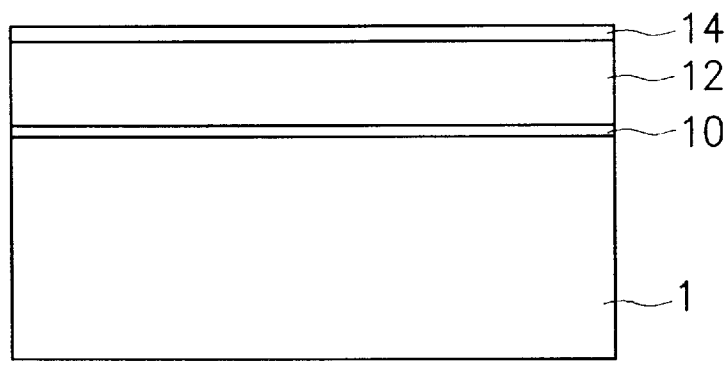

Then, in the process step shown in FIG. 3, stuffed layer 14 is formed on polysilicon layer 12. Stuffed layer 14, which plays a critical role in the process of the embodiment, is stuffed into a gate structure including oxide layer 10 and polysilicon layer 12, such that a first sidewall spacer formed in the following step will be higher than the gate structure. In this embodiment, stuffed layer 14 is preferably made of silicon oxide, prepared by LPCVD, plasma enhanced CVD (PECVD) or thermal oxidation method, with a thickness of between 200 Å and 600 Å.

Figure 4:
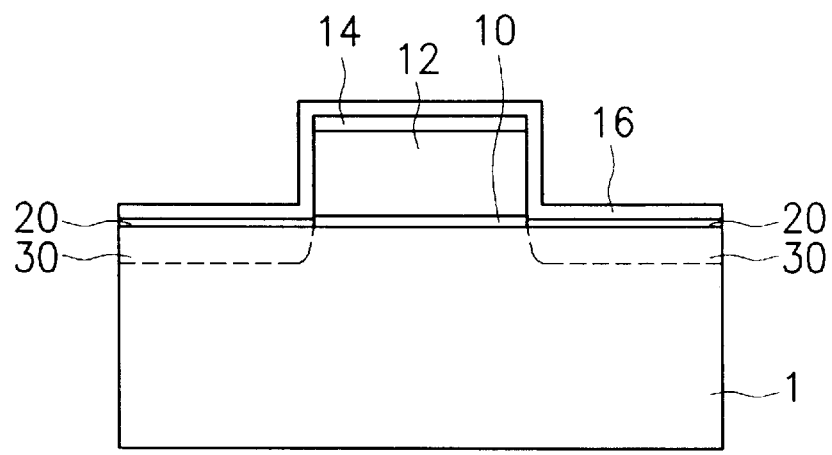

In the process step shown in FIG. 4, a gate structure is formed by etching stuffed layer 14, polysilicon layer 12 and oxide layer 10 by conventional lithography and etching, and thin dielectric layer 16 is subsequently formed on substrate 1 and on the upper face and sides of the combination of the gate structure and stuffed layer 14. In addition, pad oxide layer 20 can be optionally formed between dielectric layer 16 and substrate 1 and used for buffering the stress between layers. Dielectric layer 16 is preferably made of silicon nitride in this embodiment, with a thickness of between 100 Å and 400 Å, prepared by LPCVD method. Then lightly doped source/drain regions 30 in the LDD structure are formed by ion-implanting through dielectric layer 16. Dielectric layer 16 serves to prevent an implanting tunnel effect. It should be noted that the substrate 1 and the source/drain regions are different conducting type. Either the substrate 1 is P-type and then the source/drain regions 30 are N-type (NMOS transistors), or the substrate 1 is N-type and then the source/drain regions 30 are P-type (PMOS transistors).

Figure 5:
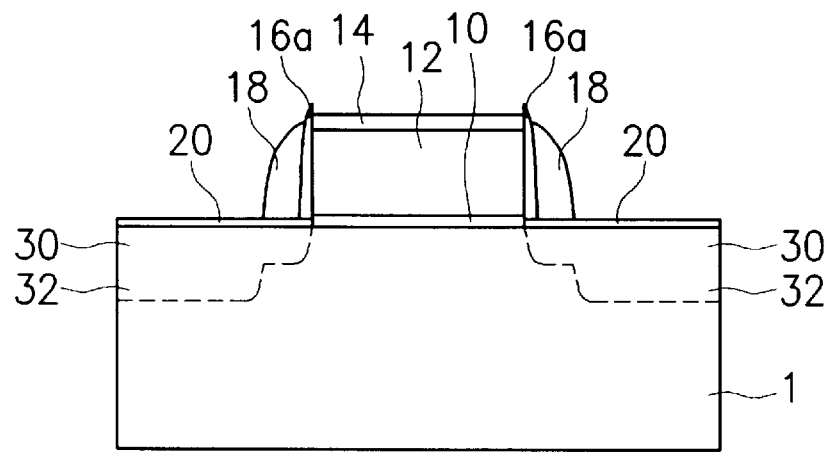

In the process step shown in FIG. 5, dielectric layer 16 is anisotropically dry-etched to form first sidewall spacer 16a at sides of the gate structure. At this time, first sidewall spacer 16a is slightly higher than stuffed layer 14, but relatively thin (lower than 400 Å). Then, at the sides of first sidewall spacer 16a second sidewall spacer 18 is formed.

The fabrication process for the second sidewall spacer 18 in this embodiment is follows: An oxide layer with a thickness of between 1000 Å and 3000 Å is at first deposited by LPCVD or PECVD method, and then anisotropically etched to form second sidewall spacer 18.

It should be noted that stuffed layer 14, which is made of oxide in this embodiment, may be partially removed during the process of forming second sidewall spacer 18. However, this removal does not matter because stuffed oxide layer 14 as well as optionally formed pad oxide layer 20 will be subsequently removed, following the step of forming second sidewall spacer 18.

Then, using second sidewall spacer 18 as an implant mask, heavily doped source/drain regions 32 are formed by implanting impurities ions, as shown in FIG. 5. This results in a well-fabricated MOS device with a LDD structure on substrate 1.

Figure 6:
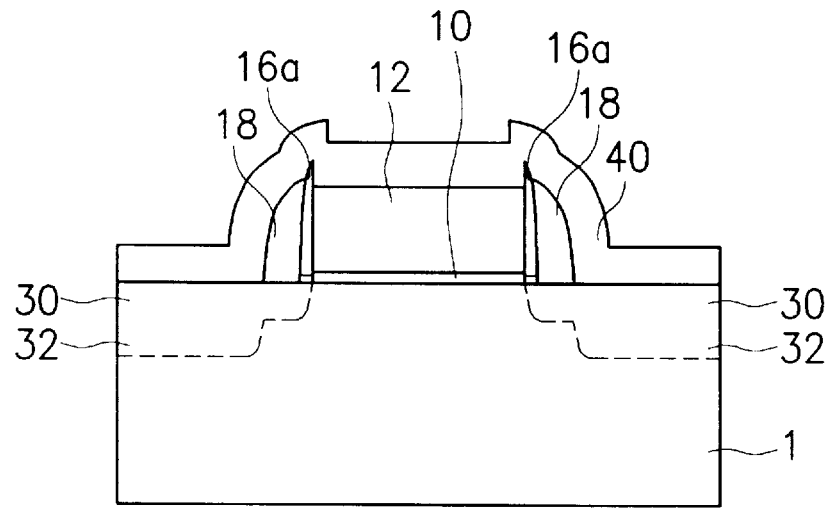
Figure 7:
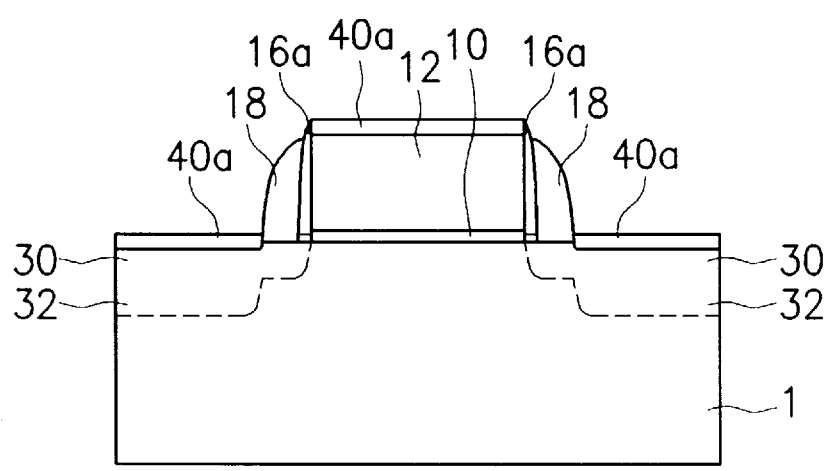

FIG. 6 and FIG. 7 show the process steps of forming salicide regions in the MOS devices. At first, titanium (or platinum) metal layer 40 with a thickness of between 300 Å and 700 Å is deposited on the topography of the MOS devices. At this time, metal layer 40 envelops polysilicon layer 12 of the gate structure, heavily doped source/drain regions 32 and sidewall spacers. Titanium material in metal layer 40 can react with the silicon material in its underlying layers by rapid thermal processing (RTP), for example, at a temperature between 650(C. and 700(C. for 30 to 60 seconds. The titanium material over the sidewall spacers is unreacted and is removed by wet etching. The complete process for preparing double spacer salicide MOS devices in the present invention is fulfilled at this time. The other process steps, prior to and followed by the above-mentioned process, are the same as the conventional ones.

Advantages of the double spacer salicide MOS device and process are described as follows:

1. The most important advantage of the present invention is that the height of the first sidewall spacer can effectively provide isolation between gates and sources/drains. Such a structure can prevent short-circuiting between the electrodes and raise the yield of the semiconductor process.
2. The dielectric layer used to form the first spacer can prevent the implanting tunnel effect during the formation of the lightly doped source/drain regions.
3. The first sidewall spacer can envelop the sides of gate polysilicon such that the sides of gate polysilicon do not oxidize during the succeeding process steps. Therefore, the bird's beak effect is reduced, and the threshold voltage and saturation current of the MOS devices can be precisely controlled, especially in the submicron process.

The foregoing description of preferred embodiments the present invention has been provided for the purposes of illustration and description. It is not intended to be exhaustive or to limit the invention to the precise forms disclosed. Many modifications and variations will be apparent to practitioners skilled in this art. The embodiments were chosen and described to best explain the principles of the invention and its practical application, thereby enabling others skilled in the act to understand the invention for various embodiments and with various modifications as are suited to the particular use contemplated. It is intended that the scope of the invention be defined by the following claims and their equivalents.

What is claimed is:

1. A method for fabricating salicide MOS devices on a substrate, comprising the steps of:

depositing an oxide layer on said substrate;

depositing a polysilicon layer on said oxide layer;

depositing a stuffed layer on said polysilicon layer;

etching said stuffed layer, said polysilicon layer and said oxide layer through a prescribed photomask which defines said polysilicon layer and said oxide layer as a gate structure;

forming a first dielectric layer continuously on a top face and side walls of said stuffed layer and said gate structure;

forming lightly doped source and drain regions in said substrate adjacent to the side walls of said gate structure;

anisotropically etching said first dielectric layer to form a first spacer at the side walls of said gate structure;

forming a second spacer at side walls of said first spacer;

removing said stuffed layer;

forming heavily doped source and drain regions in said substrate adjacent to said lightly doped source and drain regions, respectively; and forming salicide regions upon said gate structure and said heavily doped regions.

2. A method as recited in claim 1, wherein said stuffed layer is made of silicon oxide with a thickness of between 200 Å and 600 Å.

3. A method as recited in claim 2, wherein said stuffed layer made of silicon oxide is formed by low-pressure chemical vapor deposition.

4. A method as recited in claim 2, wherein said stuffed layer made of silicon oxide is formed by plasma-enhanced chemical vapor deposition.

5. A method as recited in claim 7, wherein said first dielectric layer is made of silicon nitride with a thickness of between 100 Å and 400 Å.

6. A method as recited in claim 5, wherein said first dielectric layer made of silicon nitride is formed by low-pressure chemical vapor deposition.

7. A method as recited in claim 1, wherein said salicide structure is formed by the steps of:

depositing a metal layer continuously over said gate structure and said heavily doped regions;

reacting said metal layer with silicon material of said gate structure and said heavily doped regions to form silicide compound by a thermal treatment; and removing unreacted material from said metal layer.

8. A method as recited in claim 7, wherein said metal layer is made of titanium.

9. A method as recited in claim 7, wherein said metal layer is made of platinum.

10. A method as recited in claim 1, wherein:

said stuffed layer is deposited with a pre-determined thickness;

said first spacer is made higher than said polysilicon layer of said gate structure by the predetermined thickness of said stuffed layer;

said second spacer is formed of a different material than said first spacer; and the salicide regions on said gate structure are isolated from the salicide regions on said heavily doped regions by the first spacer.

11. A method as recited in claim 10, wherein:

said stuffed layer is made of silicon oxide with a thickness of between 200 Å and 600 Å;

said first dielectric layer is made of silicon nitride with a thickness of between 100 Å and 400 Å; and said second spacer is formed by the steps of:

forming a second dielectric layer made of silicon oxide with a thickness of between 1000 Å and 3000 Å continuously over said stuffed layer, said first spacer and said substrate; and anisotropically etching said second dielectric layer to form said second spacer at the side walls of said first spacer.

12. A method as recited in claim 10, wherein said second spacer and said stuffed layer are formed by the same material and said stuffed layer is removed by the step of forming said second spacer.

13. A method as recited in claim 10, wherein said second spacer is formed by the steps of:

forming a second dielectric layer continuously over said stuffed layer, said first spacer and said substrate; and anisotropically etching said second dielectric layer to form said second spacer at the side walls of said first spacer.

14. A method as recited in claim 13, wherein said second dielectric layer is made of silicon oxide with a thickness of between 1000 Å and 3000 Å.

* * * * *